United States Patent [19]

Miszenti

[11] Patent Number: 5,480,862
[45] Date of Patent: Jan. 2, 1996

[54] METHOD FOR THE PREPARATION OF PRECURSORS FOR SUPERCONDUCTORS AND COMPOUNDS THUS OBTAINED

[75] Inventor: Giorgio S. Miszenti, Novara, Italy

[73] Assignee: Pirelli Cavi S.p.A., Milan, Italy

[21] Appl. No.: 99,949

[22] Filed: Jul. 30, 1993

[51] Int. Cl.⁶ .................. C04B 35/624; C04B 35/453
[52] U.S. Cl. .................. 505/440; 505/445; 505/512; 505/501; 505/446; 505/734; 505/735; 423/593
[58] Field of Search .................. 505/1, 737, 735, 505/734, 121, 125, 236, 238, 440, 445, 446, 501, 512, 785, 782; 423/593

[56] References Cited

U.S. PATENT DOCUMENTS

| | | | |
|---|---|---|---|
| 4,866,031 | 9/1989 | Bolt et al. | 423/593 |
| 5,236,891 | 8/1993 | Hikata et al. | 505/782 |

FOREIGN PATENT DOCUMENTS

| | | | |
|---|---|---|---|
| 304953 | 3/1989 | European Pat. Off. | |
| 285116 | 11/1988 | Japan | 505/734 |

OTHER PUBLICATIONS

Liu et al "Application of Gel Technology in Preparation of High T_c Pervochite Superconductors", *High Temperature Superconductors*, MRS Symp Proc., vol. 99, 1988 (no month).

Physica C vol. 190, No. 1 & 2, Dec. 1991, Amsterdam, NL pp. 124–125.

Solid State Communications, vol. 67, No. 6, Aug. 1988, London UK pp. 595–602.

Patent Abstract of Japan, vol. 13, No. 549 (C–662)7 Dec. 1989 and JPA-1 226 724–abstract.

Japanese Journal of Applied Physics Letters, vol. 29, No. 2, Feb. 1990, Tokyo, JP pp. 280–283.

*Primary Examiner*—C. Melissa Bonner
*Attorney, Agent, or Firm*—Brooks Haidt Haffner & Delahunty

[57] ABSTRACT

Method for the preparation of a precursor for a superconductor, comprising the addition of a condensation product to an aqueous solution of metal salts, the total or partial removal of water from the mixture thus obtained, the subsequent processing of the viscous mass obtained after having removed part of the water or the calcination of the solid gel obtained after having substantially removed all the water, wherein the condensation product is a product of esterification of citric acid with ethylene glycol prepared separately and the solution of metal salts substantially is a solution of acetates in water and acetic acid.

12 Claims, 5 Drawing Sheets

2θ

2θ

2θ

2θ

METHOD FOR THE PREPARATION OF PRECURSORS FOR SUPERCONDUCTORS AND COMPOUNDS THUS OBTAINED

DESCRIPTION

This invention relates to a method for the preparation of precursors for superconductors and compounds thus obtained.

More specifically, this invention relates to a method for the preparation of precursors for superconductors based on ceramic oxides.

As it is well known, superconductors are metals, alloys, oxides and, in general, compounds which have a drop in resistance up to values which are substantially nil at a temperature value known as the critical temperature of supercunductivity (Tc) which is characteristic of each superconductor.

During the last few years, different preparation methods for the most promising superconductor oxides have been studied and worked out. Among these are the YBCO (in the Y-Ba-Cu-O system, also known as 123, 124, etc. depending on the relative ratios of the metallic elements in the molecule), the BSCCO (Bi-Sr-Ca-Cu-O—also known as 2212 and 2223 depending on the structure of the crystalline phase—and/or Bi(Pb)-Sr-Ca-Cu-O), sometimes the latter ones being also specifically identified as BPSCCO (Bi-Pb-Sr-Ca-Cu-O or BI, PB-Sr-Ca-Cu-O or Bi(Pb)-Sr-Ca-Cu-O). It is also to be noted that the superconductive properties of these compounds are extremely sensitive even to small variations of their average stoichiometry (both for the metallic elements and their substituents, and for the oxygen content and other possible non metallic elements), as well as of their structural homogeneity. For instance, in some cases it is preferable to produce materials having a slightly changed composition in comparison with the abovementioned nominal compositions, or which comprise more than one crystalline phase. In any case, the possibility to actually produce a material having the desired composition is a very important feature of a method.

In general, the preparation of superconductors based on oxides comprise:

1) the preparation of a mixed oxide or of a finely blended mixture of oxides and sometimes also of other compounds capable of forming oxides by means of thermal treatments at sufficiently high temperatures, wherein the essential (metallic) elements are already present in the desired ratios and finely mixed (hereinafter referred to as "precursor for the superconductor"), it being capable of being transformed, essentially owing to the reactions occuring in the solid state when increasing the temperature, in the superconductive phase or phases;

2) the thermal treatment of the above mentioned precursor aimed at forming the superconductive (crystalline) phase.

In practice, steps (1) and (2) are followed by (3) the step of integration of the superconductive phase with a support (usually metallic, but also, depending on the application, of different nature) by means of intubation, spinning or deposition on ribbon or thread or the like. The steps from (1) to (3) may performed in a single stage or in separate stages.

The preparation of the superconductive phase does not necessarily imply the preparation and manipulation of a single precursor (see for instance the preparation of superconductive layers deposited directly by means of sputtering, or from the vapour phase, on suitable supports). However, in the processes actually used for the production of bulk superconductor oxides, often it is preferred to prepare a single precursor in order to reach the most favourable conditions for the subsequent steps, for instance by compacting it, that is by forming pieces of appropriate shape and size.

An example of the preparation of a superconductor for power transmission starting from precursors made of powdered oxides is the following technique which is known as "powder in tube".

A silver tube is filled with the precursor or with a superconductive powder prepared from the same, and the filled tube is submitted to drawing, until it forms a compact oxide thread coated with a silver layer. By means of repeated mechanical operations, such as rolling and pressing, and thermal treatments, there are finally obtained threads or ribbons of superconductor oxide, coated with a silver layer.

In the most conventional and direct method, the preparation of the superconductor oxides is accomplished with the so called "ceramic" method, that is with dry procedures, which comprise the calcination of mixtures (previously formed by means of mechanical grinding and mixing) of powders of oxides, carbonates and other suitable compounds of the elements making up the desired superconductors, in stoichiometric ratios. However, such procedures do not allow the attainment of an intimate and uniform mixture of the desired elements. For such reasons wet methods have been developed as an alternative.

In particular, as far as the preparation of oxides for the superconductors cited above is concerned, it has been proposed to overcome the drawbacks of the conventional "ceramic" techniques by means of solutions of the metallic elements, thus obtaining a mixture at the atomic level and in the desired ratios. The known wet methods differentiate themselves, in addition to the solvents used and the type of solution obtained (aqueous or organic solvents, with the presence of chelating agents, of metallo-organic compounds, salt solutions, colloidal solutions, etc.), also by the manner in which the desired mixtures separated therefrom (coprecipitation, hydrolysis, gel formation, spray-drying, freeze-drying, etc.) and by the suitability to maintain at best in the separated mixtures the ratios among the metallic elements and their dispersion degree of as in the solution. An important group of these methods makes use of organic compounds which are subsequently removed by means of pyrolysis and/or oxidative thermal treatments, such as those required in any case for the formation of superconductor oxides. The plurality of the proposed methods is, on the one hand, a sign of the interest for the superconductors and, on the other hand, of the difficulties met for the attainment of valuable compounds by means of flexible processes applicable on large scale in the preparation of the most part of the desired precursors, with a minimum adjustment of the operative parameters.

Hereinafter, the expression "organic methods" indicates, for convenience sake, the methods which make use of substantial quantities of organic ingredients.

Among the known "organic methods", one of the most interesting is the so called citrate method which essentially comprises preparing an aqueous solution of nitrates or other derivatives of the desired metals, chelating the metal cations with citric acid, polymerizing the citric acid by itself or with ethylene glycol, removing water by evaporation and calcining the solid gel thus obtained (A. Aoki, Jpn. J. Appl. Phys. 29, (2), L270–L272, (1990); T. Asaka et a l., Jpn. J. Appl. Phys. 29, (2), L280–L283, (1990); Tian-Shyng Heh et al., Jpn. J. Appl. Phys. 29, (4), 652–655, (1990)).

Indeed, because of their high water solubility, the use of nitrates, as well as of a certain excess of nitric acid, is somewhat generalized and especially needed in order to solubilize bismuth in the preparation of the important precursors of BSCCO family.

However, this method has some serious drawbacks due to the presence of nitrates; in fact, during the calcination of the solid gel, the nitrates give off toxic nitrogen oxides and sometimes these explode (J.C.W. Chien et al., J. Pol. Sc. 28, 2008 (1990)).

Another drawback of nitrates is linked to the highly oxidative nature of the nitric anion which can promote the combustion, even in an atmosphere devoid of oxygen, of the mass rich in organic compounds during its calcination.

Surprisingly it has now been found that nitrates can be replaced by acetates when citric acid is not added as such to the solution but it is made to react and condense separately with ethylene glycol instead of in situ; this esterification product between citric acid and ethylene glycol will, in short, be referred to as the "condensation product".

The use of preformed polymerization and polycondensation products in the preparation of precursors for superconductors had already been investigated by J.C.W. Chien et al. (J. Pol. Sc. 28, 1999–2033 (1990)) but these authors have not used any condensation product of citric acid with ethylene glycol. Moreover, the method of these authors has the disadvantage of requiring the use of nitrates, because the acetates turned out to be poorly soluble, and even of organic solvents, in particular of dimethylformamide.

Therefore, the "organic methods" described so far and among these those with citrates can give satisfactory results on small scale but are not suitable for medium to medium-large scale preparations for the known drawbacks associated with the use of chelating agents and/or of organic solvents, in particular nitrogenous solvent such as dimethylformamide, and/or of nitrates.

A first object of this invention is therefore to provide a method for the preparation of precursors for superconductors based on ceramic oxides without using nitrates and/or chelating agents and/or nitrogenous organic solvents, i.e.a method easily applicable on a medium-large scale.

More particularly, an object of this invention is a method for the preparation of a precursor for a superconductor, comprising the addition of a condensation product to an aqueous solution of metal salts, the total or partial removal of water from the mixture thus obtained, the subsequent processing of the viscous mass obtained after having removed substantially all the water, or the calcination of the solid gel after having removed substantially all water, characterized in that the condensation product is an esterification product of citric acid with ethylene glycol prepared separately and that the solution of metal salts is substantially a solution of acetates in water and acetic acid.

In the step where water is removed, the major part of the acetic acid is also removed.

Metal acetates can be added as such or prepared in situ by treatement of a suitable metallic compound with glacial or diluted acetic acid.

Examples of metallic compounds preferred for the preparation of acetates in situ are those known for being capable of forming acetates with glacial or diluted acetic acid. Typically, the above metallic compounds are selected from the group comprising oxides, carbonates, citrates and hydrates of yttrium, barium, bismuth, copper, lead, strontium and calcium, with acetic acid.

Their stoichiometric ratios vary depending on the composition of the superconductor which one wishes to prepare.

Possible small quantities of citrates or even nitrates resulting from the attack of small fractions which are difficult to dissolve, do not jeopardize the result which are obtained with the method of this invention.

Specific examples of metallic compounds suitable for the preparation of acetates in situ are:

$Y_2O_3$, CuO and $BaCO_3$, for the YBCO system; and $Bi_2O_3$, CuO, $PB(CH_3COO)_2.Pb(OH)_2.H_2O$, $Pb(CH_3COO)_2.nH_2O$, $Pb(OH)_2$, PbO, $SrCO_3$, $CaCO_3$, (instead of the hydrated lead acetate the corresponding hydrated citrate $Pb_3(C_6H_5O_7)_2.3H_2O$ can be used, as long as it is in small portions), for a BSCCO system.

The chosen metallic compounds, preferably as fine and reactive powder, are brought into solution in a suitable excess of glacial acetic acid in the case of $Bi_2O_3$, in acetic acid suitably diluted with water in other cases, by heating under vigorous mixing.

The chosen metallic compounds are added gradually to the acid, preferably in inverse order to their solubilization rate. For instance, in the case of the preparation of a BSCCO system from the metallic compounds indicated above, it is preferable to first add $Bi_2O_3$ to glacial acetic acid preheated to at least 60° C., subsequently heating between 60° C. and the boiling temperature in order to completely dissolve the reaction mixture (at the most, a slight Opalescence is acceptable), then diluting with distilled water. Possible insoluble mixtures are instead treated with a strong acid, for instance with the minimum amount of nitric acid, and recovered separately as described further on.

In the case of other metallic compounds, it is indeed preferred to use acetic acid properly diluted with deionized water or, preferably, distilled water (the typical ratios of acid to water ranges from 1:1 to 1:5 (w/w)) and brought to a suitable temperature (50°–100° C.) before each addition.

Depending on the case, the speed of mixing and the degree of dilution will be selected in such a way to avoid the formation of slow to dissolve aggregates (particularly CuO) and/or the precipitation of acetates. However, at the same time, ratios of water/acid so high as to cause hydrolysis must be carefully avoided.

Even though it is not a necessary condition, it is preferable to add gradually and separately the various metallic compounds to the solution.

Preferably, the temperature is maintained between 60° C. and the boiling point of the reaction mixture even after having completed the solubilization of all the metallic compounds and even during the subsequent step which consists in the addition, under mixing, of a suitable amount of a solution, preferably freshly prepared and not preheated, of a "condensation product" prepared by reacting at 110°–170° C. from 0.5 to 5, preferably from 0.7 to 2 and, better still, from 0.9 to 1.2 moles of ethylene glycol for each mole of citric acid. The person skilled in the art will, however, have no difficulty in selecting experimentally the optimum ratio for each case.

Also the amount of "condensation product" which is added to the solution of the metallic compounds can be selected very easily in view of factors known to the person skilled in the art such as the cation gram equivalents in the solution and the chelating ability of the "condensation product". Preferably, it will be such that it can chelate all the metal cations present in the solution.

The solution thus obtained, will then be concentrated by heating to boiling or almost to boiling, under stirring and, if it is desired, under reduced pressure, possibly collecting the water and acetic acid vapours which develop, until the viscosity of the mixture prevents further mixing of the mass.

Afterwards the solution can be completely solidified by heating it open without stirring up to about 130° C. or under stirring and reduced pressure until the viscosity of the reaction mixture is such that stirring is blocked.

The compound thus obtained is a solid glass-like mass, more or less spongy and friable, transparent or often slightly opalescent, but homogeneous with the exception of the cases (essentially temporary) of localized overheating. Instead, it should not present, in unacceptable quantity, phenomena of separation or segregation of the components. In such a case, particularly if the temperature has not gone over a certain limit (typically around 130° C.) for too long, it is still possible to avoid the above drawback by bringing the mass back into solution, while still hot, with deionized or, preferably, distilled water, and possibly with the further addition of a solution of the "condensation product", and afterwards again concentrating the solution as described above but in the absence or almost absence of acetic acid.

It has in fact been found that, contrary to the case of YBCO, in the case of BSCCO (containing Sr, Ca, Cu, PB and possibly other elements, but above all Bi), the presence of free citrates deriving for instance from the use of lead citrate, can be counterproductive since it can provoke precipitations and segregations even during the concentration or solidification step.

However, it has also been found that it is possible to avoid or at least reduce within negligible levels the amount of precipitates by suitably reducing the amount of residual acetic acid in the solution during the first step (concentration), in particular by progressively going by means of various subsequent cycles of partial concentration and redilution with deionized or preferably distilled water and at each cycle progressing up to a higher degree of concentration with respect to the previous one. Thanks to the development of acetic acid vapours together with those of water, it is possible to obtain a decrease in the residual acetic acid in the bulk.

As an alternative it is possible to apply different pressures in order to favour the ratio acid/water in the developing vapours.

Instead of completely solidifying the mixture by heating it up to about 130° C. in an open container or under reduced pressure, as described above, when the concentrated solution reaches a suitable degree of viscosity by means of heating, it can be used (even as thermoplastic glass, if part of the water is still present and/or with the addition of ethylene glycol, or of plastifying agents, dispersing agents and the like) for all the possible applications, according to conventional techniques (T. Umeda et al., Adv. Ceramic Materials, 3 (5), 520–522, (1988)) such as spinning, immersion, spin coating and similar processes, for instance to obtain fibers, layering or application of layers or thin coatings up to 20 micrometers or more on a support of various nature such as silver, aluminum, strontium titanate, magnesium oxide and the like.

In the large scale preparation of the precursor, the solidified mass results preferably porous, friable, essentially amorphous to RX-ray diffraction, and free of crystalline phases, which would indicate the occurrence of separation or structuring processes and of specific segregations. This is essential for securing the intimate dispersion of the various elemental species present in the initially defined ratios.

Moreover, the product thus obtained, essentially heat hardening, is prone to be decomposed by heating with formation of solid residues without formation, not even temporarily, of liquids capable of dissolving or segregating the compounds of the various elemental metallic species present.

In other words, the metallic elements, dispersed in the organic matrix of the mass thus solidified, do not liquefy during the heating step which is then performed for demolishing, via pyrolysis and/or oxidation, the remaining organic structure.

This fact is an important advantage of the method of this invention with respect to the known citrate methods wherein the drying, even if carried out at low temperatures, often implies the presence, in the solidified bulk, of salts (nitrates, etc.) in crystalline form which afterwards tend to melt or to form liquids during the subsequent decomposition step at higher temperature.

An advantage derived from the possibility of using limited ratios of the organic matter is that prior to the calcination, the solid mass is less tenacious and can be broken up and brought more easily to the subsequent processing step.

The pyrolysis and calcination are carried out at increasing temperatures until gradual decomposition and removal of the organic components occurs.

In the initial phase it is preferred to work in lack of oxygen or air and the volatile products which develop can be recovered or destroyed or burned, for instance in air in an open flame. Subsequently, once the production of volatile products has ended, the residual mass is further treated at progressively higher temperatures in the presence of oxidizing gases (nitrogen/air, air/oxygen, ozone and the like) up to a temperature higher than 600° C., preferably from 700° to 750° C., to remove the carbon residues.

The porous compound, more or less consolidated or powdered thus obtained, is the precursor for the desired superconductor, which can be formed at relatively low temperatures by means of reactions at the solid state among the compounds present in the precursor because these latter ones have reached the little degree of structuring and separation as possible thanks to the initial dispersion and the avoidance of liquid phases at every stage of the pyrolysis and of the oxidative calcination.

In fact such reactions are made easy by the small sizes of the grains, i.e. of the crystals formed, and by the high degree of dispersion of the constituents achieved with the method of this invention.

It is in fact known that these features offer the advantage of high reactivity and susceptibility to evolve towards structures gradually more stable and structured, such as the sought superconductors themselves.

It is known that the diffusion and reaction processes among the components which occur in the preparation of a superconductor are also made easier by a suitable and proper packing of the precursor, for instance by means of pressing, optionally preceeded by disaggregation processes.

An important advantage of the present invention is that it allows to prepare superconductors containing bismuth such as, for example, BSCCO without using nitric acid.

It is therefore a further object of this invention to provide a precursor for a superconductor prepared according to the process of this invention.

The precursor according to this invention may have the same composition as the superconductor made therefrom. However, it may also be different.

As a matter of fact, a further particularly interesting embodiment of the present invention comprises the preparation of a precursor wherein at least two different powders, at least one of which has been prepared according to the present invention, are mixed to a suitable degree according to conventional techniques. Amongst the most notable cases are those wherein one of the powder components is essentially the superconductive phase BSCCO 2212, optionally having a modified composition, and/or containing Pb, in a microcrystalline powder form. According to the present interpretation of the kinetic in the formation of phase 2223, the crystallites (crystalline granules) of phase 2212 could be the effective nuclei for the subsequent formation of phase 2223, which is the most interesting since it exhibits the highest critical temperature. Thus, phase 2212 can be conveniently prepared on its own and then mixed with a fine reactive precursor powder or powders, having a complementary composition suitable to yield a composition which corresponds to BSCCO 2223, optionally containing Pb.

Thus, the initial superconductive phase 2212, optionally in the form of submicron crystallites, reacts with the complementary composition(s) during the thermal treatments performed in the manufacturing process for the final product, which can be a superconductive wire, layer and so like.

In this procedure, it is advantageous to use the powders of this invention which, as a result of the intimate internal mixture of the metal ions, can yield the superconductive phase more quickly and/or at a lower temperature. Powders consisting of particularly fine crystalline grains are thus obtained which have a favourable reactivity for the formation of the final phase 2223.

This procedure is also applicable to the preparation of other superconductive systems such as, for example, YBCO.

Still another object of this invention is therefore a superconductor comprising a suitable support and at least a mixed superconductor oxide layered on or incorporated into said support, wherein the mixed superconductor oxide is a precursor prepared according to this invention.

Said superconductor may also be made from at least two precursor powders having complementary compositions suitable to yield, after mixing according to conventional techniques, a bimodal or multimodal precursor having the same composition as that of the superconductor.

In turn, one or more but not all of the precursor powders may have been manufactured according to a conventional process.

Preferably, at least one precursor powder has been previously treated at a suitable temperature to form a partially or totally superconductive phase.

The following examples are intended to illustrate this invention without, however, limiting it in any way.

BRIEF DESCRIPTION OF THE DRAWINGS

The accompanying FIGS. show the X-ray diffraction patterns obtained by inserting the material in an X-ray diffractometer "Siemens D 500" and working with the reference radiation given in the examples wherein the individual FIGS. are mentioned. On the abscissa of the diagrams is reported, on a linear scale, twice the angle theta in degrees as it is measured by the instrument, theta being the X-rays diffraction angle. On the ordinate is reported on an arbitrary linear scale, the measured intensity. More specifically.

EXAMPLE 1

Figure 1:
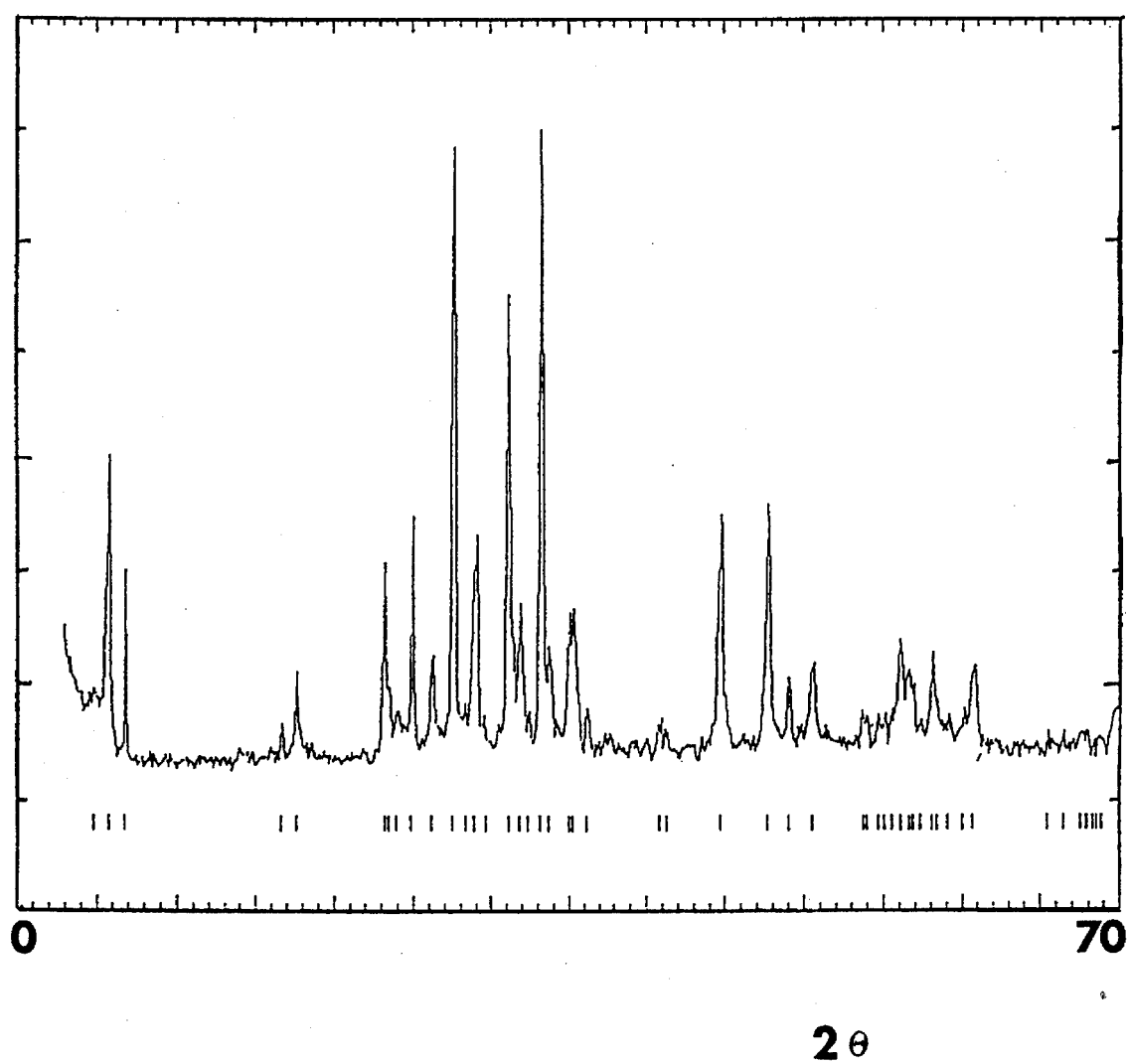
FIG. 1 is the x-ray diffraction pattern for sample BJ613.

Preparation of a "condensation product" of citric acid with ethylene glycol

A ready aqueous solution containing 292.50 g of citric acid (MW=192.1) is used, or it is prepared by dissolving 320.00 g of citric acid monohydrate ($C_6H_8O_7 \cdot H_2O$, MW=210.14) in about 320 g of deionized or distilled water under stirring and, if necessary, by moderately heating in order to promote the dissolving process.

To the above solution 100.00 g of ethylene glycol are added, the temperature is increased gradually up to the boiling point (105°–110° C.) and heating is continued under vigorous stirring until the temperature is raised to 140°–145° C. and the residual mass is equal to about 360–365 g (the boiling temperature increases as the water is removed; typically the mass is reduced to about 420 g when the temperature reaches 120° C.).

With constant stirring, the reaction mixture is cooled by the addition of a sufficient amount of water (about 600 g) to form a solution which is stable even at room temperature. Lastly, it may be convenient, in order to make easier the quantitative determination, to further deionized or distilled water to a total of 1000 ml.

It has been found that if the above mentioned final temperature is increased up to about 160°–180° C., the weight of the reaction mass is reduced up to about 336–340 g before the condensation product becomes insoluble in water. The insoluble condensation product proved to be much less effective for the purpose of this invention.

In a similar manner, "condensation products" were prepared by using molar ratios for ethylene glycol/citric acid of from 0.5 to 5. Thus, it became apparent that ratios less than 1, for instance 0.5, can imply precipitation of the bismuth compounds, if any, in the initial step of mixing the solution of the "condensation product" with the dilute acetic solution of cations; on the contrary, ratios higher than 2, for instance 5, even though do not give rise to the initial precipitation of bismuth, tend to cause separation of precipitates in the advanced stage of the concentration, before gel formation, and possible prevention of a sufficient gel formation.

EXAMPLE 2

Preparation of a precursor for BSCCO 2223 with PB (sample BJA22)

Elemental composition: $Bi_{1.8}Pb_{0.33}Sr_{1.87}Ca_{1.99}Cu_3O_n$.

In a 600 ml Pyrex glass beaker, equipped with a magnetic stirring bar, 90 g of glacial acetic acid are placed and, under vigorous stirring, 5.067 g of $Bi_2O_3$ are added.

The beaker is covered with a watch glass to contain the dispersion of the vapours and allow refluxing of the condensate, and the mixture is heated to almost the boiling temperature until all the compound is dissolved. Limited amounts of insolubles and/or precipitates possibly present at the bottom, be it at this point or during subsequent processing of the solution, should be removed and treated separately, according to conventional techniques, in order to dissolve them and add then back to the main solution; however, the residual presence of small portions of nitrates may be accepted.

Once the solubilization is completed, the clear or slightly opalescent solution is diluted with about 150 g of deionized or distilled water and gradually, under stirring, 2,884 g of powdered Cu are added while heating is resumed.

Once a clear blue solution is obtained, heating is stopped and each of the following ingredients, 3.336 g of $SrCO_3$, then 2.406 g of $CaCO_3$ and, lastly, 1.394 g of lead citrate (II) trihydrate, or, better still, 1.505 g of lead acetate (II) trihydrate instead of citrate, are added gradually and carefully, to limit frothing, and dissolved completely; then heating is resumed to about the boiling temperature until complete solubilization.

Dilution is accomplished with distilled water up to a total volume of about 290 ml and then there are added 80 ml of a solution (from the one diluted to a total of 1000 ml) not heated of the "condensation product" prepared according to the preceeding Example 1, while heating is resumed, under vigorous stirring, up to the boiling temperature.

The solution is then slowly concentrated while keeping it at the boiling temperature always under vigorous stirring and leaving the beaker uncovered to promote evaporation and avoiding overheating.

When the total volume is reduced to about 150 ml, the solution is again diluted with about 50 g of deionized or distilled water and concentrated to about 120 ml and the dilution/concentration cycle is repeated 4 or 5 times, each time concentrating more than the previous one to reduce the amount of residual acetic acid.

Lastly, the solution is further concentrated by discontinuing the stirring when the solution becomes too viscous. At this point it is preferred to cover the beaker to limit the formation of a film on the surface and the solution is heated uniformly for a sufficient time (typically one night) at 130° C. in a oven to avoid overheating.

A homogeneous glass-like or sometimes spongy mass is thus obtained. However, if segregations occur, the mass is again dissolved by heating in about 150 g of deionized or distilled water and brought to dryness as described above, under as vigorous stirring as possible, but in one single cycle. Thus a homogeneous mass is obtained which is glass-like and sometimes spongy and friable; typical colour is blue-green, but it is somewhat variable depending on the drying conditions (temperature, duration, etc.).

The thus obtained dry mass is disaggregated and transferred into an aluminum crucible to be pyrolyzed in absence of air by gradual heating to remove the volatile products which can be burned directly in air on an open flame, and in any case not going over the 600° C. Subsequently, the flow of air, or the amount of oxygen in the gaseous flow, is gradually increased to avoid eccessive sparking and/or overheating, and 700° C. are reached and maintained for about 20 hours to remove the carbon residues.

The product thus obtained is the precursor for BSCCO.

After grinding to reduce the aggregates, the BSCCO is obtained by means of treatment in an open silver crucible at 830° C. for 16 hours.

After grinding in an agate mortar in the presence of absolute ethyl alcohol followed by drying up to 200° C. in dry air, with this BSCCO samples of threads coated with silver were made with the conventional technique "powder in tube".

These threads proved to be superconductors, with critical current density values higher than 500 A/cm$^2$ (samples M36/1.5-1-P1 and M36-L1-P1 and a 1500 A/cm$^2$ (sample M36/1.5-4-P1) at the temperature of liquid nitrogen (77 K), B=OT.

EXAMPLE 3

Preparation of a precursor for BSCCO 2223 with PB (Sample BJ613)

Elemental composition: $Bi_{1.8}Pb_{0.4}Sr_2Ca_{2.2}Cu_3O_n$

In a 600 ml Pyrex glass beaker, equipped with a magnetic stirring bar, 90 g of glacial acetic acid are placed and, under vigorous stirring, 5.067 g of $Bi_2O_3$ are added.

The beaker is covered with a watch glass to contain the dispersion of the vapours and allow refluxing of the condensate, and the mixture is heated to almost the boiling temperature until all the compound is dissolved. Limited amounts of insolubles and/or precipitates possibly present at the bottom, be it at this point or during successive processing of the solution, should be removed and treated separately, according to conventional techniques, to dissolve them and add back to the main solution; however, the residual presence of small portions of nitrates may be accepted.

Once the solubilization is completed, the clear or slightly opalescent solution is diluted with about 110 g of deionized or distilled water and gradually, under stirring, 2.884 g of powdered Cu are added while heating is resumed.

Once a clear blue solution is obtained, heating is stopped heating and each of the following ingredients, 3.568 g of $SrCO_3$, then 2.660 g of $CaCO_3$ and, lastly, 1.825 g of lead acetate (II) trihydrate, are added gradually and carefully, to limit frothing, and dissolved completely; heating is resumed to about the boiling temperature until complete solubilization.

Subsequently, 52 ml of a cold solution (from the one diluted to a total of 1000 ml) of the "condensation product" prepared according to the preceeding Example 1 are added, while heating is resumed, under vigorous stirring, up to the boiling temperature, and dilution is accomplished with deionized or distilled water up to a volume of about 380 ml.

The solution is then slowly concentrated while keeping it at the boiling temperature always under vigorous stirring and leaving the beaker uncovered to promote evaporation and avoiding overheating.

When the total volume is reduced to about 150 ml, the solution is again diluted with deionized or distilled water up to twice the volume and concentrated to about 120 ml and the cycle of dilution/concentration is repeated twice, each time concentrating more than the previous one to reduce the amount of residual acetic acid.

Lastly, the solution is further concentrated up to about 50 ml by discontinuing the stirring when the solution becomes too viscous. At this point it is preferred to cover the beaker, to limit the formation of a film on the surface and the solution is heated uniformously for a suitable time at 130° C. in a oven avoid overheating. A homogeneous glass-like or sometimes spongy mass is obtained.

The above mass is then dissolved again by heating in about 250 g of deionized or distilled water, 25 ml of the solution of the "condensation product", prepared according the preceeding Example 1, are added, and the solution is dried again proceeding as described above, under as vigorous stirring as possible, but in one single cycle. Thus, a homogeneous glass-like and possibly spongy and friable mass is obtained; its typical colour is blue-green, but it is somewhat variable depending on the drying conditions (temperature, duration, etc.). The dry mass thus obtained is disaggregated and transferred into an aluminum crucible to be pyrolyzed in absence of air by gradual raising the temperature to remove the volatile products which can be burned directly in air on an open flame, and in any case not exceeding 600° C. Subsequently, the flow of air, or the amount of oxygen in the gaseous flow, is gradually increased to avoid eccessive sparking and/or overheating, and 700° C. are reached and maintained for about 20 hours, to remove the carbon residues.

The product thus obtained is the precursor for BSCCO.

The latter one can be obtained by subsequent treatment in air at 830°–8400° C. for 20 hours.

After grinding in an agate mortar in the presence of absolute ethyl alcohol followed by drying and subsequent treatment at 850° C. for 110 hours in air in an open silver container, it was obtained a product showing the characteristic diffractogram of BSCCO 2223 reported in FIG. 1 (RX Cu-Ka, sample BJ613).

With this BSCCO, samples of thread coated with silver were made with the conventional technique "powder in tube".

These threads proved to be superconductors with critical current density values higher than 1500 A/cm$^2$ (samples M26/1.5-2-P1 and M26/1.5-4P-P2 and a 2000 A/cm$^2$ (sample M27/1.5-2-P1) at the temperature of liquid nitrogen (77 K), B=OT.

EXAMPLE 4

Preparation of a precursor for BSCCO 2212 (Samples BJ322, BJ117B, BJ627A)

Elemental composition: $Bi_2Sr_2CaCu_2O_n$

In a 1000 ml Pyrex glass beaker, equipped with a magnetic stirring bar, 200 g of glacial acetic acid are placed and, under vigorous stirring, 16.5 g of $Bi_2O_3$ are added.

The beaker is covered with a watch glass to contain the dispersion of the vapours and allow refluxing of the condensate, and the mixture is heated to almost the boiling temperature until all the compound is dissolved. Limited amounts of insolubles and/or precipitates possibly present at the bottom, be it at this point or during successive processing of the solution, should be removed and treated separately, according to known techniques, to dissolve and add back them to the main solution; however, the residual presence of small portions of nitrates may be accepted.

Once the solubilization is completed, the clear or slightly opalescent solution is diluted with about 245 g of deionized or distilled water and gradually, under stirring, 5.63 g of fine powdered CuO are added while heating is resumed, if necessary.

Once a clear blue solution is obtained, heating is stopped and each of the following ingredients, 10.45 g of $SrCO_3$, then 3.54 g of $CaCO_3$ are added gradually and carefully to limit frothing and dissolved completely; the mixture is then heated up to the boiling emperature until complete solubilization.

Afterwards, 220 ml of a cold solution (from the one diluted to a total of 1000 ml) of the "condensation product" prepared according to the preceeding Example 1, are added and heating is resumed under vigorous stirring up to the boiling temperature.

The solution is then concentrated leaving the beaker uncovered to promote evaporation and avoiding overheating.

When the total volume is reduced to about 350 ml, the solution is again diluted with about 80 g of deionized or distilled water and concentrated to about 220 ml and the cycle of dilution/concentration is repeated some times, each time concentrating more than the previous one to reduce the amount of residual acetic acid.

Lastly, the solution is further concentrated by discontinuing the stirring when the solution becomes too viscous. At this point it is preferred to cover the beaker, to limit the formation of a film on the surface and avoid overheating the solution is heated uniformously for a suitable time at 130° C. in a non ventilated oven. In the case of formation of segregations, the mass is dissolved again by heating in about 250 g of deionized or distilled water (with optional addition of 20 ml of the "condensation product") and brought again to dryness as described above, until possible under vigorous stirring, but in a single cycle.

A glass-like homogeneous mass is thus obtained, typically blue-green but somewhat variable in colour depending on the drying conditions (temperature, time, etc.).

Figure 2:
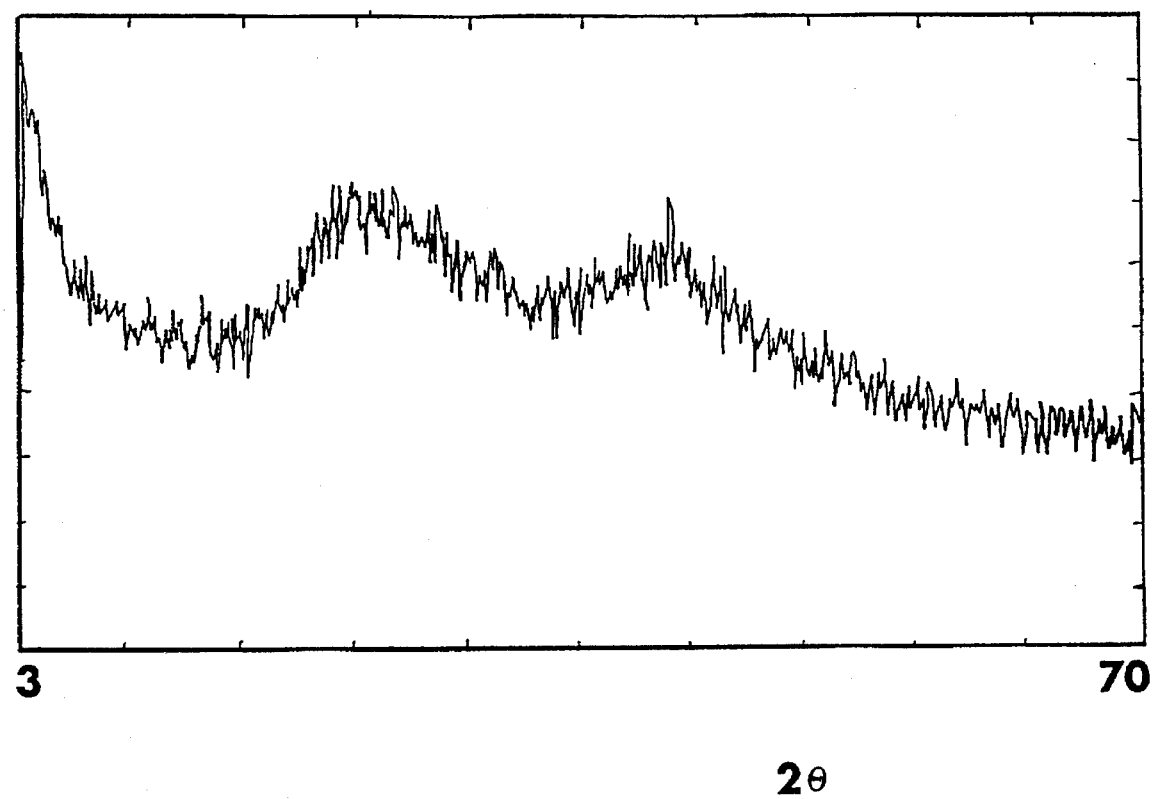
FIG. 2 is the x-ray diffraction pattern for sample BJ615.

Diffractogram shown in FIG. 2 (RX Cu-Ka, sample BJ615, dried for 16 hours at 120°–130 ° C.) is typical for a material substantially amorphous (because there is no evidence, with respect to the baseline, of characteristic peaks of crystalline phases segregated during the removal of the liquid solvent to the detriment of the homogeneity of the compound, even at the submicroscopic scale) thanks to the effective action on the various cations from the "condensation product" prepared according to the preceeding Example 1, present in the solution even before concentrating it. It prevents the crystallization and the precipitation of its components up to the complete removal of the solvent.

The thus obtained dry mass is disaggregated and transferred into an aluminum crucible to be pyrolyzed in the absence of air by gradually raising the temperature to remove the volatile products which can be burned directly in air on an open flame, and in any case not exceeding 600° C. Subsequently the flow of air or the amount of oxygen in the gaseous flow is gradually increased to avoid eccessive sparking and/or overheating, and 700° C. are reached and maintained for about 20 hours.

The product thus obtained is the precursor for BSCCO.

The latter one can be obtained by means of subsequent treatment in air at about 850° C. for 20 hours.

After wet grinding in absolute ethyl alcohol in an agate mortar, followed by drying, the mass is again treated at 840° C. in air for about 100 hours in a silver container.

Figure 3:
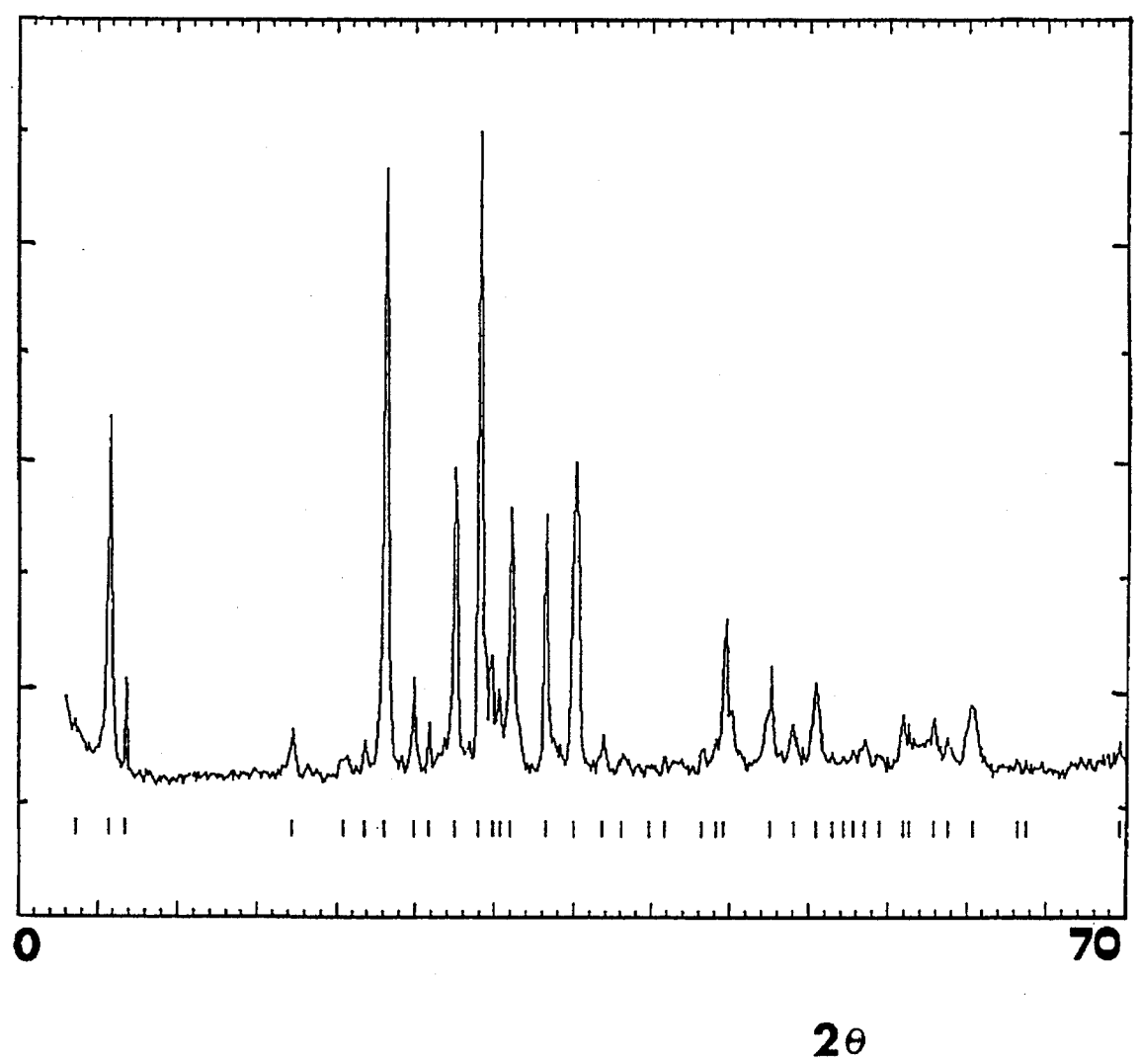
FIG. 3 is the x-ray diffraction pattern for sample BJ322.

The BSCCO thus obtained was disaggregated in moist conditions in the presence of absolute ethyl alcohol and finally dried up to 200° C. in air. The X-ray diffraction spectrum of FIG. 3 (RX Cu-K, sample BJ322) shows that in the product is present the typical phase of BSCCO 2212.

With this powder samples of threads coated with silver were manufactured, with the known technique "powder in tube".

Thermal treatment of thread samples, typically up to 5 cm long, was carried out in an oven under a gas flow according to the following cycle: quick increase to 915° C. and permanence at this temperature for 30 minutes, quick drop to 840° C. and permanence at this temperature for 110 hours, drop in three hours to 500° C., then the flow of dry air is replaced by a flow of pure nitrogen ($O_2+H_2O$ total<3 ppm) with permanence for 20 hours at 500° C. and cooling always in the presence of nitrogen. At the temperature of liquid nitrogen (77 K) a sample had a critical current density Jc(77 k, OT)=1730 A/cm$^2$ (sample M24/1.5-13). Another (sample M24/1.5-8) proved to be . superconductor with a critical temperature Tc(R=0)=88.5 K and a critical current density equal to 1290 A/cm$^2$ (77 K, B=OT). Still another (sample M17A-1) had a critical current density at 4.2 K of 49,000 cm$^2$ at B=OT and of 25000 A/cm$^2$ at B=7 T (P. Metra et al., ICPTS'90, FIG. 3, 29th Apr. 1990, Rio De Janeiro, Brazil).

EXAMPLE 5

Preparation of Layers (film thick) of BSCC 2212 on a support of Ag

A portion of the final disaggregated suspension of BSCCO 2212 in absolute ethyl alcohol, obtained from the precursor as described in Example 4, was used by depositing some drops thereof until covering the entire superior surface of plane rectangular silver blades of 4.5×45×0.2 mm placed horizontally. Afterwards the major part of the alcohol was evaporated at 50°–70° C. in dry air and then gradually raising the temperature up to 150° C. to completely dry the deposited layers. The pieces were then transferred in a tubular oven and, while keeping them in a flow of dry air, the temperature was raised at the rate of about 1000° C./hour up to 920° C., kept at this temperature for 30 min, then lowered at the rate of about 100° C./hour up to 840° C., kept at this level for about 40 hours, then lowered at the above rate up to 500° C.; at this point the flow of air was replaced with a flow of pure nitrogen ($O_2+H_2O$ <3ppm) and the temperature was maintained at a constant level for 24 hours, then the temperature was reduced to room temperature at a rate lower than 150° C./hour, while keeping in a flow of nitrogen.

The layers thus obtained (samples BJ627G/BKB20) had a straight cross section from 0.25 to 0.30$^2$ mm and proved to be superconductors, at the temperature of liquid nitrogen (77 K) and B=OT, with a critical current of about 1000 A/cm$^2$, measured with transport direct current along the longitudinal direction of the samples (criterion 1 microV/cm).

EXAMPLE 6

Preparation of a precursor for YBCO 123 (sample code YI928)

Elemental composition: Y Ba$_2$Cu$_3$O$_n$

In a Pyrex glass beaker, equipped with an efficient magnetic stirring bar, 400 g of glacial acetic acid diluted to 25% by weight in deionized or distilled water are placed, the beaker is covered with a watch glass to contain the dispersion of the vapours and allow refluxing of the condensate, and the solution is heated to about 60° C.

Then 16.00 g of finely powdered CuO are added under vigorous stirring.

Limited amounts of insolubles and/or precipitates possibly present at the bottom, be it at this point or during subsequent processing of the solution, should be removed and treated separately, according to known techniques, to dissolve and then add them to the main solution; if necessary it is permitted to tolerate the residual presence of small portions of nitrates.

After having completely dissolved the copper oxide, 7.60 g of finely powdered Y$_2$O$_3$ are added and, under stirring, the temperature is raised to promote the complete solubilization, if necessary. The solution is then diluted with about 500 ml of water and, lastly, 26.40 g of BaCO$_3$ are added.

The thus obtained solution is heated up to almost the boiling temperature. 125 ml of a cold solution (from the one diluted to a total of 1000 ml) of the "condensation product" prepared according to the preceeding Example 1, are then added; heating is resumed, under vigorous stirring, to the boiling temperature.

While leaving the beaker uncovered to promote evaporation and avoiding overheating, the solution is concentrated up to 200 ml, or even more, discontinuing the stirring when the solution becomes too viscous.

At this point it is preferred to cover the beaker to limit the formation of a film on the surface and the solution is heated uniformously for a sufficient time at 130° C. in a oven to avoid overheating.

Figure 4:
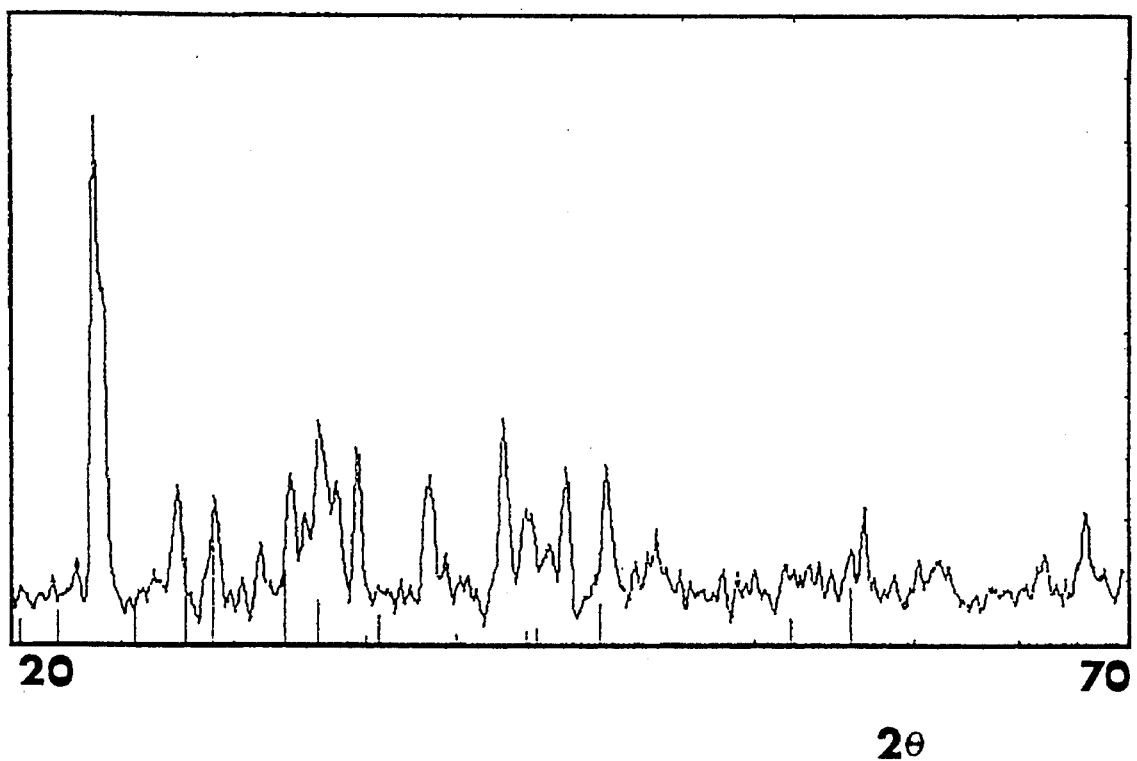
FIG. 4 is the x-ray diffraction pattern for sample YI530B750.
Figure 5:
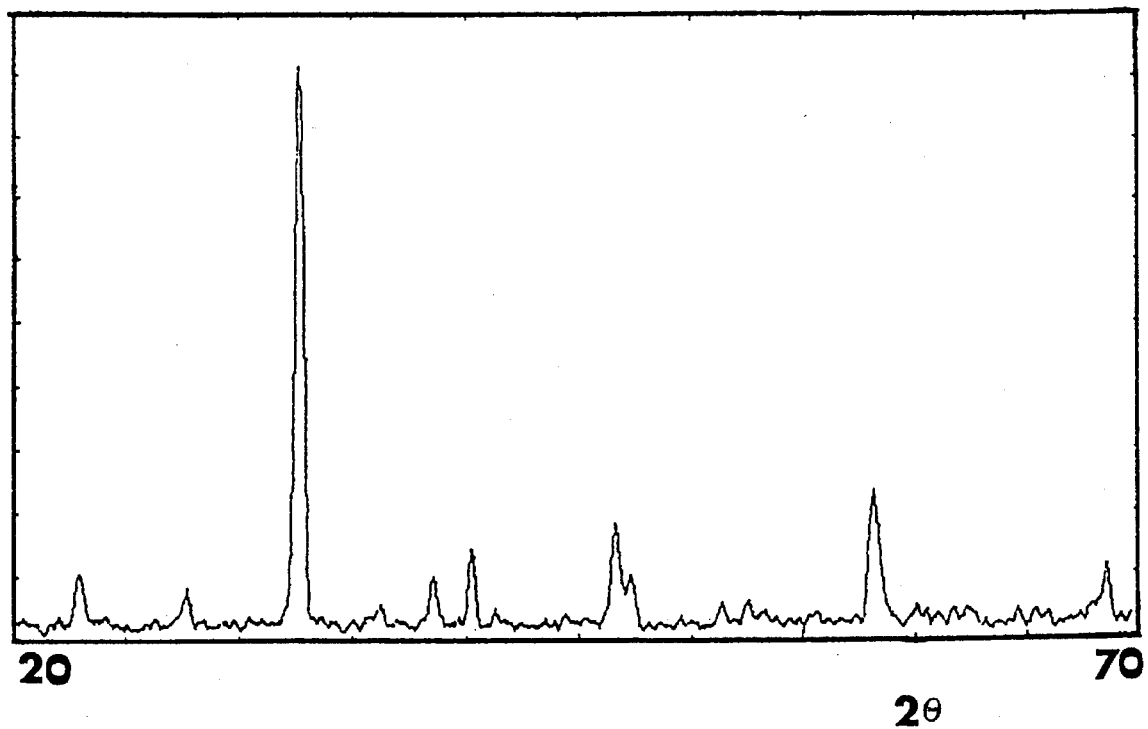
FIG. 5 is the x-ray diffraction pattern for sample YI530B830.

A homogeneous glass-like mass is thus obtained which is generally spongy, greenish in colour (typically bottle green), variable depending on the drying conditions (temperature, time etc.). The dry mass thus obtained is disaggregated and transferred into an aluminum crucible to be pyrolyzed in the absence of air by gradually raising the temperature as much as it is sufficient to remove the volatile products which can be burned directly in air in an open flame, and in any case not exceeding 600° C. Subsequently the air flow or the amount of oxygen in the gaseous flow is gradually increased to avoid eccessive sparking and/or overheating, and a temperature of from 700° to 750° C. is reached and typically maintained for from 10 to 60 hours. The diffractogram (RX Cu-Ka, sample YI530B750) of FIG. 4 relates to a precursor after treatment for 55 hours at 750° C. and shows that the desired phase, i.e. YBCO 123, has not yet formed; however, thanks to the fine size and reactivity of the particles which constitute this precursor, a subsequent treatment for 20 hours at only 845° C. is sufficient to obtain the prominent presence of the above phase as it is proved by the relevant peaks, which are more prominent in the diffractogram of FIG. 5 (sample YI530B830).

EXAMPLE 7

Preparation of a precursor for a YBCO 124 with Ca (Sample YI904C)

Elemental composition: YO$_{0.9}$Ba$_2$Ca$_{0.1}$Cu$_4$O$_n$

In a Pyrex glass beaker, equipped with a magnetic stirring bar, 1165 g of a 22% (w/w) aqueous solution of diluted acetic acid are placed, the beaker is covered with a watch glass to contain the dispersion of vapours and allow refluxing of the condensate, and the mixture is heated to about 60° C.

Afterwards, 13.20 g of Y$_2$O$_3$ as a fine powder are added gradually, under vigorous stirring.

Limited amounts of insolubles and/or precipitates possibly present at the bottom, be it at this point or during the subsequent processing of the solution, should be removed and treated separately, according to known techniques, to dissolve and then add them to the main solution; the residual presence of small portions of nitrates is permitted, if necessary.

Once the yttrium oxide is completely dissolved by increasing, if necessary, the temperature up to almost the boiling temperature, the solution is diluted with 820 g of water and the temperature is brought back to about 60° C. and the process continues with the gradual addition of 41.33 g of finely powdered CuO, under vigorous stirring. If necessary, the temperature is temporarily raised to promote complete solubilization. 51.26 g of $BaCO_3$ and then 1.30 g of $CaCO_3$ are added. The final solution thus obtained is heated to almost boiling and, lastly, 484 ml of a cold solution (from the one diluted to a total of 1000 ml) of the "condensation product" prepared according to the preceeding Example 1 are added while heating up to the boiling temperature is resumed under vigorous stirring.

The solution is then concentrated to 700 g, or even less, at the boiling temperature leaving the beaker uncovered to promote evaporation but avoiding overheating, discontinuing stirring when the solution becomes too viscous.

At this point, it is preferred to cover the beaker to limit the formation of a film on the surface, and the solution is heated uniformously for a sufficient time at 130° C. in a oven to avoid overheating.

The dry mass thus obtained is disaggregated and transferred into an aluminum crucible to be pyrolyzed in the absence of air, by gradually raising the temperature as much as it is sufficient to remove the volatile products which can be burned directly in air on an open flame, and in any case not exceeding 600° C. Subsequently the flow of air or the amount of oxygen in the gaseous flow is gradually increased to avoid eccessive sparking and/or overheating, and 700° C. are reached and maintained for about 20 hours.

The product thus obtained is the precursor for YBCO. Micrografic examination at the scanning microscope of a typical powder thus obtained proves that it is essentially formed by aggregates of very fine particles, having size typically lower than 0.2–0.3 micrometers; i.e. well lower than that attainable when grinding the components. This also accounts for the marked reactivity of these powders.

EXAMPLE 8

Preparation of a precursor for BSCCO 2223 containing Pb (Sample BJ323A)

Elemental composition: $Bi_{1.6}Pb_{0.4}Sr_2Ca_2Cu_3O_n$

In a 1000 ml Pyrex glass beaker, equipped with a magnetic stirring bar, there are placed 240 g of glacial acetic acid, to which 13.512 g of $Bi_2O_3$ are added, under vigorous stirring.

The beaker is covered with a watch glass to contain the dispersion of the vapours and allow refluxing of the condensate, and the mixture is heated to almost the boiling temperature until all the residue is dissolved. Small amounts of insolubles and/or precipitates possibly present at the bottom, whether at this point or during the subsequent processing of the solution, should be removed and treated separately, according to known techniques, to dissolve and then add them to the main solution; it is permitted to tolerate the residual presence of small portions of nitrates, if necessary.

Once the solubilization is completed, the clear or slightly opalescent solution is diluted with about 300 g of deionized or distilled water and, under stirring, 8.652 g of finely powdered soluble CuO are gradually added while heating is resumed, if necessary.

Once a clear blue solution is obtained, heating is stopped and each of the following ingredients, 10.704 g of $SrCO_3$, then 7,254 g of $CaCO_3$ and, lastly 5.473 g of lead acetate (II) trihydrate, are added gradually and carefully to limit frothing and dissolve completely, then heating is resumed to almost the boiling temperature until complete solubilization.

Afterwards 225 ml of a cold solution (from the one diluted to a total of 1000 ml) of the "condensation product" prepared according to the preceeding Example 1 are added and heating is resumed under vigorous stirring up to the boiling temperature.

Then, the solution is concentrated leaving the beaker uncovered to promote evaporation and avoiding overheating, under vigorous stirring.

When the total volume is about 450 ml, the solution is again diluted with about 200 g of deionized or distilled water and concentrated to about 350 ml and the dilution/concentration cycle is repeated some times, each time concentrating more than the previous one to reduce the amount of residual acetic acid.

Afterwards, the solution is further concentrated and stirring is discontinued when the solution becomes too viscous.

At this point it is preferred to cover the beaker to limit the formation of a film on the surface and the solution is heated uniformously for a sufficient time at 130° C. in a oven to avoid overheating.

A glass-like or possibly spongy homogeneous mass is obtained. However, when some segregations occur, the mass is dissolved again by heating in about 300 g of deionized or distilled water and brought again to dryness as described above, under vigorous stirring until it is possible, but in a single cycle.

Figure 6:
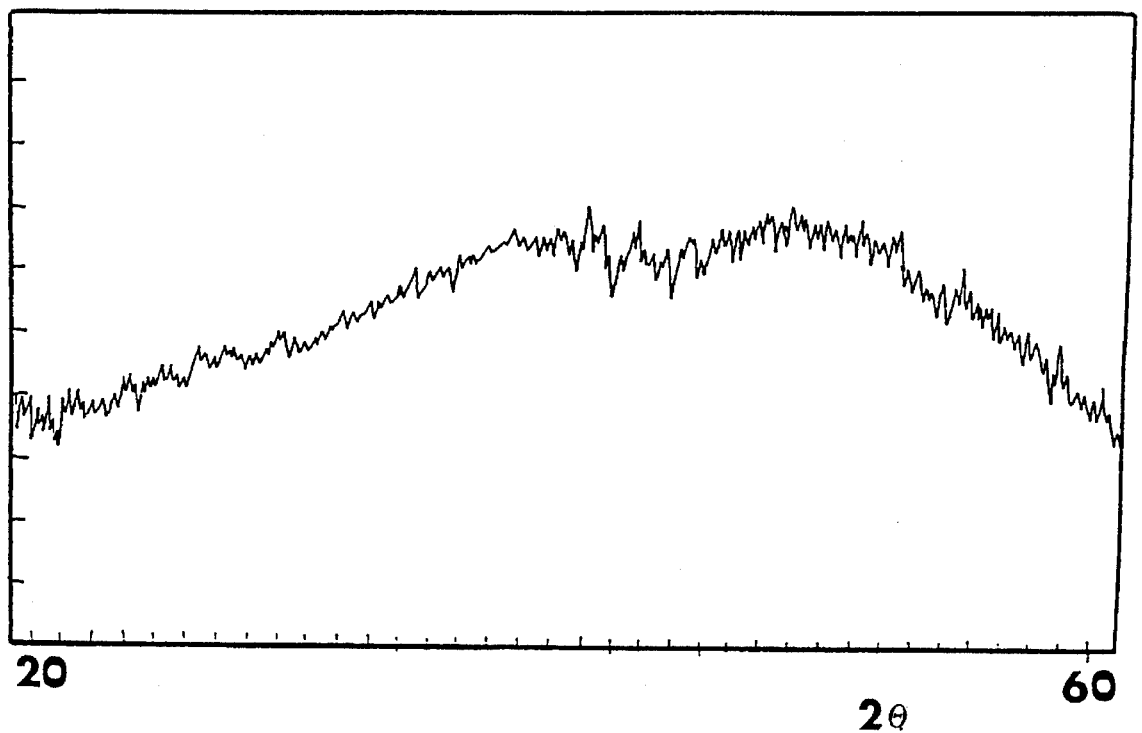
FIG. 6 is the x-ray diffraction pattern for sample BIA06.
Figure 7:
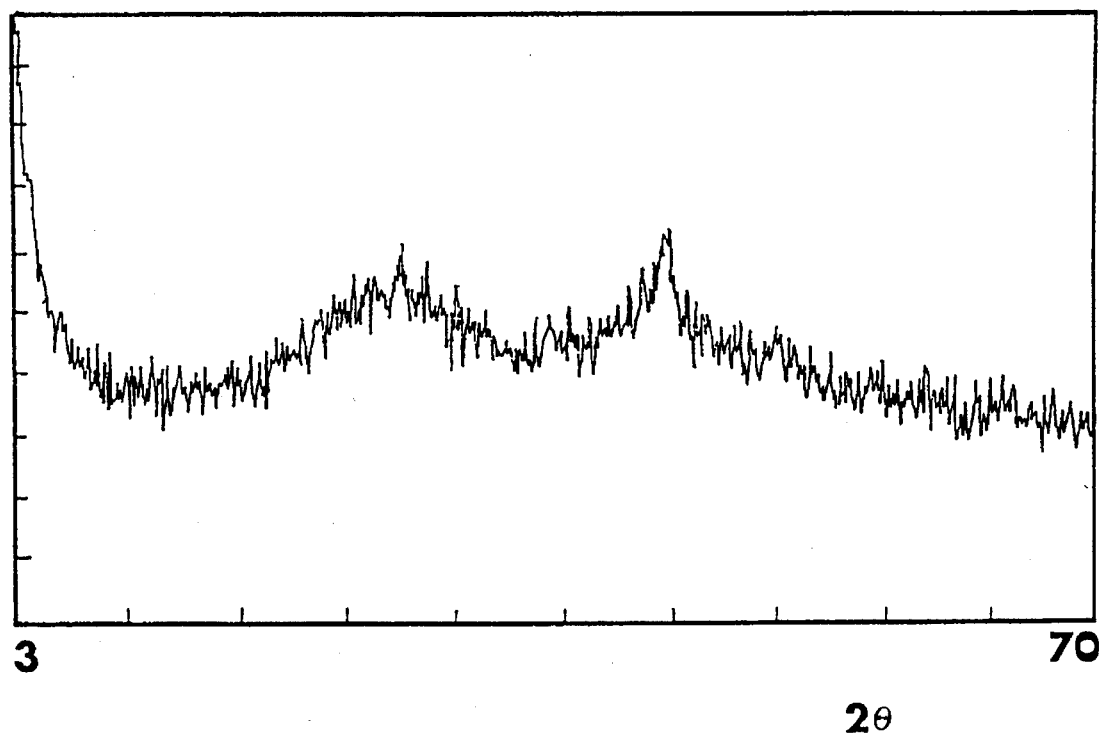
FIG. 7 is the x-ray diffraction pattern for the same sample as in FIG. 6 following reprocessing for about 2 hours in air at 200° C.

A glass-like homogeneous mass is thus obtained, typically blue-green but somewhat variable in colour depending on the drying conditions (temperature, time, etc.). Diffractogram of FIG. 6 (RX Cu-Ka, abscissa 2θ from 60 20°, sample BIA06, dried for 16 hours at 130° C.) is typical for a substantially amorphous material (because there is no evidence, with respect to the baseline, of peaks characteristic of crystalline phases segregated during the removal of the liquid solvent to detriment of the homogeneity of the compound, even at the submicroscopic scale) thanks to the effective action on the various cations from the "condensation product" prepared according to the preceeding Example 1, present in the solution even before concentrating it. It prevents the crystallization and the precipitation of its components up to the complete removal of the solvent. The same material, reprocessed for about 2 hours in air at 200° C., still presents essentially the same characteristics, see FIG. 7. These results are definitely different from those which can be obtained with the known "citrates" methods, which do not make use of the finding of this invention, and wherein at this stage, that is in the dried material but before the pyrolysis, the presence of crystallized and, therefore, segregated saline phases is shown (for instance, nitrates, A. Aoki, Jpn J. Appl. Phys., vol 29, (2), 1990, p. 1270–L272, FIG. 3).

The dry mass thus obtained is disaggregated and transferred into an aluminum crucible to be pyrolyzed in the absence of air by gradually raising the temperature as much as it is sufficient to remove the volatile products which can be burned directly in air on an open flame, and in any case not exceeding 600° C. Afterwards, the flow of air or the amount of oxygen in the gaseous flow is gradually increased to avoid eccessive sparking and/or overheating, and 700° C. are reached and maintained for about 20 hours.

The product thus obtained is the precursor for BSCCO.

After a possible grinding to reduce the aggregates, BSCCO is obtained by treating it in an open silver crucible at 840° C. for about 20 hours.

After disaggregation in an agate mortar in the presence of absolute ethyl alcohol and subsequent drying up to 200° C. in dry air, it was treated at 852° C. for 100 hours in dry air.

After further disaggregation and drying, as described above, samples of threads coated with silver were manufactured with this BSCCO, with the known technique "powder in tube".

A sample of these threads (sample M20/1.5-4P1P2) showed the following values of critical current density:

$Jc\ (77K,\ B=0T)=1440\ A/cm^2$ $Jc\ (4.24K,\ B=0T)=8900\ A/cm^2$ $Jc\ (4.24K,\ B=6T)=1470\ A/cm^2$

EXAMPLE 9

Comparative tests with the condensation product of citric acid prepared without ethylene glycol In a Pyrex glass beaker 72.00 g of citric acid monohydrate $C_6H_8O_7.H_2O$ (MW=210.14) are placed. While continuously stirring and avoiding overheating the mass is heated to 145° C. and this temperature is maintained until the mass weight is decreased of 5.4 g. Then the solution is cooled by adding about 100 ml of distilled water. The solution is then brought to a total volume of 225 ml with distilled water thus obtaining what will be indicated as solution "A".

The above described procedure is repeated except that the same amount of citric acid is brought with the same procedure to a temperature of about 162°–165° C., keeping it under stirring for the time necessary to reduce the mass weight of 12.33 g. The process is then continued as described above until there are obtained 225 ml of a solution indicated as "B".

The above described procedure is still repeated except that the same amount of citric acid is brought with the same procedure to a temperature of about 165°–170° C., keeping it under stirring for the time necessary to reduce the mass weight of 15.30 g. The process is then continued as described above until there are obtained 225 ml of a solution indicated as "C".

Separately 3 identical solutions are prepared for the precursor for BSCCO 2223, following the directions of Example 8, but, instead of using 225 ml of the solution of the "condensation product" prepared according to Example 1, solutions "A", "B" and "C" are used, respectively. What happens is that as soon as the solutions are added, in each of the cases an abundant white precipitate is formed which does not dissolve even with the addition of 20 g of ethylene glycol. This shows that ethylene glycol is necessary for preparing an effective "condensation product" according to the present invention.

EXAMPLE 10

Comparative tests of the "condensation product" prepared with different ratios of ethylene glycol and citric acid Four solutions of the "condensation products" are prepared according to the procedure described in Example 1 but changing the molar ratios between ethylene glycol and citric acid, and that is by using for each one 72.00 g of citric acid monohydrate ($C_6H_8O_7.H_2O$, MW=210.14) and 72 g of distilled water to dissolve it. Afterwards, for the solutions indicated as "D", "E", "F" and "G" are used 11.70, 22.50, 45.00 and 112.50 g, respectively, of ethylene glycol, corresponding to molar ratios of glycol to citric acid equal to 0.5, 1.0, 2.0 and 5.0.

Finally, a fifth solution, indicated as "H", is prepared with a molar ratio equal to 1.0 proceeding as for solution "D", but without heating the mass so that citric acid does not "condense" with ethylene glycol.

Separately 5 identical solutions are prepared for the precursor for BSCCO 2233, following the directions of Example 8 but the solutions "D", "E", "F", "G" and "H" are used, respectively, instead of 225 ml of the solution of the "condensation product" prepared according to Example 1.

The results of these tests are shown in the following table:

| Solution | After the addition | After the concentration |
| --- | --- | --- |
| "D" | precipitate | — |
| "E" | regular | regular |
| "F" | regular | regular |
| "G" | regular | irregular (precipitate) |
| "H" | abundant precipitate | — |

The above shows that the presence of not condensed ethylene glycol and citric acid, as is the case with "H", does not give good results.

Furthermore, it is apparent that the preferred range for the glycol/acid ratio is around one.

EXAMPLE 11

Preparation of a precursor of lead BSCCO 2223 with Ag (BK717)

Nominal composition: $Bi_{1.6}Pb_{0.4}Sr_2Ca_2Cu_3O_n$ in an intimate mixture with 12 w/o of metallic Ag.

Into a Pyrex glass beaker, equipped with a magnetic stirrer and stirring bar, 240 g of pure glacial acetic acid are placed and then 13.51 g of $Bi_2O_3$ are added under vigorous stirring. The beaker is covered with a watch glass to avoid the dispersion of the vapours and allow refluxing of the condensate. The solution is heated almost to the boiling temperature until all the sediment is dissolved (any small quantities of insoluble solid residue which do not dissolve, if any, is separated and treated apart with a minimum of hot diluted nitric acid; the hot acid solution is then evaporated to near dryness, the residue dissolved under heating with glacial acetic acid and finally this solution is combined with the main solution).

Once the solubilization is completed, the limpid, or at the most slightly opalescent, solution is diluted with approximately 300 g of pure water and then 8.65 g of CuO, in the form of a soluble fine powder, are added gradually under stirring and, if necessary, with heating of the solution. To the thus obtained blue, limpid solution, 10.70 g of $SrCO_3$, then 7.25 g of $CaCO_3$ and finally 5.47 g of $Pb(COCH_3)_2$ trihydrate are gradually and carefully added without heating, so as to limit frothing, until each ingredient is dissolved. The solution is then heated to almost boiling temperature until solubilization is completed.

225 ml of a solution (from the one diluted to a total of 1000 ml) of the "condensation product", prepared according to Example 1, are added and heating is resumed, under vigorous stirring, up to the boiling temperature, diluting to a total of about 1060 ml with distilled water.

Small quantities of insoluble residue, if any, are separated and dissolved in a minimum of hot concentrated nitric acid; the solution is then evaporated to near dryness, taken up with water and combined with the main solution.

The solution is then concentrated by evaporation under vigorous stirring; overheating is carefully avoided.

When the total volume is reduced to about 600 ml the solution is again diluted with about 250 g of pure water, reconcentrated to about 120 ml and the cycle of dilution and concentration is repeated several times, each time concentrating more than the previous cycle to reduce the amount of the residual acetic acid. The solution .is finally concentrated to about 250 ml.

At this point the solution is diluted to about 330 ml with distilled water and a second solution (B), which is prepared simultaneously, as described below, is added under vigorous stirring.

The solution B is prepared by dissolving, under stirring but without heating, 4.77 g of $Ag_2O$, in the form of a fine powder, in 120 ml of an aqueous solution containing a sufficient amount (but not more than 7.2 g) of $NH_4OH$ and finally adding 80 ml of the solution of the aforementioned "condensation product". The solution B must have a pH less than 6 and is best used as soon as it is prepared in order to avoid hydrolysis of the "condensation product".

The resultant solution is concentrated by evaporation, under vigorous stirring to avoid overheating, until it becomes very viscous. The beaker is covered with a watch glass to limit the formation of a superficial film and, with uniform heating to avoid overheating, the beaker is maintained for a suitable time at 130° C. in an unventilated oven. A dry homogeneous mass is obtained which is easily crumbled and transferred to an alumina crucible.

The mass is then pyrolized in the absence of air by gradually heating up to 600° C. The volatile products can be burnt off directly in air with an open flame. After cooling, the powdery mass is transferred to a smaller crucible, which is covered and reheated again up to 550° C. The crucible is then uncovered and calcination is continued in air for a further 2 hours. The temperature is then raised gradually to 710° C. over a period of 2 hours and maintained at this level for 17 hours. After cooling, the powder is broken into small pieces, ground in an agate mortar and heated in a small basin made of pure silver, open to the air, to from 835° to 840° C. for 19 hours.

A sample of the powder thus obtained was further ground in an agate mortar. The ground powder was then pressed into a pure silver tube having an outer diameter of 8 mm and an inner diameter of 4.8 mm, and sealed at both ends. The diameter of the tube was then reduced, by repeatedly beating with a rotary swager, to a final value of 1.5 mm.

A 50 mm length of the wire thus obtained was pressed at about 50 tons pressure and then thermally treated in a stream of argon, containing 8% (v/v) oxygen, for 120 hours at 830° C. (the temperature increase and decrease rate was of 150° C. per hour). At a temperature of 77 K and B=0 T, the wire proved to be a superconductor, with a critical current density of 300 A/cm$^2$ and, after repeating the pressing step and thermal treatment at 835° C. a value of about 1300 A/cm$^2$ was measured for $J_c$ at a temperature of 77 K and B=0 T (sample M47P1-P).

EXAMPLE 12

Preparation of a bimodal precursor of lead BSCCO 2223 (BL320).

Nominal composition: $Bi_{1.8}Pb_{0.4}Sr_2Ca_{2.2}Cu_3O_n$ (made of a mixture of B(P)SCCO 2212 already prepared, 12.5 mMol, having a nominal composition $Bi_{1.8}Pb_{0.4}Sr_2Ca_{1.2}Cu_2O_{n'}$, and a complementary portion of the precursor having a suitable composition, 12.5 mMol; nominal composition,, $CaCuO_2$).

A) Working similarly to the method described in Example 3, a sample of lead BPSCCO 2212 was prepared.

5.242 g of $Bi_2O_3$ were dissolved in 126 g of glacial acetic acid, the resultant solution was diluted with 152 g of water and 1.989 g of CuO were dissolved therein. 3.690 g of $SrCO_3$, then 1.501 g of $CaCO_3$ and finally 1.897 g of $Pb(COCH_3)_2$ trihydrate were dissolved in the solution. To the solution thus obtained 56 ml of the "condensation product", prepared according to Example 1, were added under stirring.

The solution volume was reduced by boiling under stirring from about 300 ml to about 160 ml. Distilled water was then added to 210 ml and the solution was concentrated to about 50 ml. The beaker was covered with a watch glass and the residue was dried overnight at a temperature of 130° C. in a ventilated oven.

Since the dried mass did not appear to be completely homogeneous, it was taken up with both 50 g of distilled water and 7 ml of the abovementioned "condensation product". The small quantity of insoluble solid residue (0.1 g) was separated and treated with concentrated nitric acid (less than 1 ml), evaporated to near dryness, dissolved under heating with a small quantity (less than 1 ml) of diluted (1:4) acetic acid and this final solution was combined with the main one. The resultant solutions was then dried as described in the preceding examples.

The mass obtained from the final drying at 130° C. was crumbled and treated at 550° C. in an alumina crucible in the absence of air. The crucible was then uncovered, to expose the product to the air, and heated to and maintained at a temperature of 710° C. for 17 hours.

Upon cooling, the powder was heated to 845° C. in a small basin made of silver, open to the air, for 19 hours to obtain phase 2212. The presence of phase 2212 was detected by X-ray diffraction.

B) The quantity required for the complementary portion was prepared in a similar way.

9 g of acetic acid were diluted in 35 g of water and 0.994 g of CuO were dissolved in the solution under stirring with moderate heating. 1.251 g of $CaCO_3$ were then dissolved in the solution while stirring and heating. To the solution thus obtained 16.5 ml of the abovementioned "condensation product" were added. The solution was then concentrated to a volume of less than 45 ml and dried, in a covered beaker, overnight in an oven at 130° C.

The dried mass was crumbled and heated to 550° C. in an alumina crucible in the absence of air. The crucible was then uncovered, to expose the product to the air, and heated to and maintained at 710° C. for 38 hours.

The two portions A) and B) were finally combined and mixed together. The mixture was then ground with a suitable quantity of absolute ethyl alcohol using an agate mortar in a dry atmosphere.

Upon drying, the mixture was placed in a small basin made of pure silver and heated to 830° C. in the presence of air for 1 hour, then in a pure nitrogen stream for 3 hours and finally in an argon stream, containing 8% (v/v) oxygen, at a temperature of from 825° to 830° C.

Using this mixture a length of pure silver tube (outer diameter=8 mm, inner diameter=6 mm) was filled. Before sealing both ends with pure silver covers, the tube was exposed to an argon stream, containing 8% (v/v) oxygen, for 1 hour at from 825° to 830° C. and then cooled. After sealing, the tube was cold drawn several times, each time reducing the diameter from 3 to 5% until a final diameter of 1.5 mm was obtained. A sample P2 of about 50 mm of the wire thus obtained was pressed at about 50 tons pressure and heated to 820° C. in an argon stream, containing 8% (v/v) oxygen, for 50 hours (the temperature increase and decrease rate was of 150° C. per hour) The wire sample thus obtained showed a critical current density of 748 A/cm$^2$ at 77 K and B=0 T. After repeating the pressing step and the heating at 820° C. for 120 hours, the measured value of $J_c$ was 4230 A/cm$^2$. A third pressing, again at 50 tons pressure, followed by a third heating treatment at 820° C. for 120 hours yielded a value of J=5740 A/cm$^2$ at 77 K and B=0 T (sample P2/1.5P(6)PP).

EXAMPLE 13

Preparation of a bimodal precursor of lead BSCCO 2223 (BL430).

Nominal composition: $Bi_{1.8}Pb_{0.4}Sr_2Ca_{2.2}Cu_3O_n$ (made of a mixture of BSCCO 2212 already prepared (12.5 mMol) having a nominal composition $Bi_{1.8}Sr_{1.8}Ca_{0.9}Cu_{1.8}O_n$, and a complementary portion of the precursor having a suitable composition, 12.5 mMol; nominal composition, $Pb_{0.4}Sr_{0.2}Ca_{1.3}Cu_{1.2}O_{n''}$).

A) Working similarly to the method described in Example 4, a sample of BSCCO 2212 was prepared.

5.242 g of $Bi_2O_3$ were dissolved in 64 g of glacial acetic acid, the solution was then diluted with 77 g of water, and 1.790 g of CuO were dissolved therein. Into the resultant solution 3.321 g of $SrCO_3$, and then 1.126 g of $CaCO_3$ were dissolved. To the final solution obtained 77 ml of the "condensation product" solution, prepared according to Example 1, were added under stirring.

After drying, the mass was crumbled and heated to 500° C. in an alumina crucible in the absence of air. The crucible was then left uncovered, to expose the product to the air, and heated to and maintained at a temperature of 710° C. for 16 hours.

Upon cooling, the powder was heated in a small basin made of silver, open to the air, at 845° C. for 19 hours to obtain phase 2212.

B) The quantity required for the complementary portion was prepared in a similar way.

25.5 g of acetic acid were diluted in 32.2 g of water; into this solution 1.193 g of CuO were dissolved while heating moderately under stirring. Afterwards 1.897 g of $Pb(COCH_3)_2$ trihydrate, 0.369 g of $SrCO_3$ and 1.627 g of $CaCO_3$ were also gradually dissolved while stirring and heating. To the thus obtained solution 25.5 ml of the abovementioned "condensation product" were added. The resultant solution was then concentrated to less than 30 g of total residue. This was then dried overnight at 130° C.

Since the glass-like mass obtained did not appear to be completely homogeneous it was taken up and heated in 50 ml of water and 5 ml of the abovementioned "condensation product" to obtain a homogeneus solution. The solution was then concentrated by boiling under stirring to form a fairly viscous product (<26 g total residue). The viscous product was dried overnight in an oven at 130° C., in a covered beaker.

The mass obtained from the drying process at 130° C. was crumbled and heated to 500° C. in an alumina crucible in the absence of air. The crucible was then uncovered, to expose the product to the air° and then heated to and maintained at 710° C. for 16 hours.

The 2 portions A) and B) were finally combined and mixed together. The mixture was then ground with a suitable quantity of absolute ethyl alcohol using an agate mortar in a dry atmosphere.

After drying, the mixture was heated in air to 710° C. for a further 16 hours.

Using this mixture a length of about 70 mm of pure silver tube (outer diameter=7.5 mm, inner diameter=5.5 mm) was filled. The apparent density of the material was 2.45 g/cm$^3$. After pressing the precursor powder into the silver tube, the tube was heated in air to 830° C. for 19 hours and, as soon as it was cooled, both ends were sealed with silver covers. The tube was then cold drawn several times, each time reducing the diameter from 3 to 5 % until a final diameter of 1.2 mm was obtained. The drawn wire was then cold-finished using rollers having a diameter of 50 mm and rotating at a rate of 0.6 cm/second until a final wire thickness of 0.1 mm was obtained by a series of steps, each step reducing the diameter by 10%. A length of about 35 mm of this wire was pressed at 50 tons of pressure. After an initial thermal treatment in an argon stream, containing 8% (v/v) oxygen, for 50 hours at 830° C. (the temperature increase and decrease rate was of 150° C. per hour), pressing followed by thermal treatment was repeated twice to obtain sample P8/1.2(LP)(1)PP. This sample was approximately 4 mm wide, 0.070 mm thick and showed a critical current density value of 14,500 A/cm$^2$ at 77 K and B=0 T.

X-rays diffractograms and measurements of the magnetic susceptability as a function of temperature confirmed that while the initial precursor contained only phase 2212, with a critical temperature of less than 95 K, the wire samples obtained from it essentially comprise superconductor 2223 with Tc>105 K. X-ray diffractograms, apart from excluding the presence of residues of phase 2212 exceeding the sensitivity of the method, show a high degree of preferred orientation of the crystal structure, with the C-axis perpendicular to the plane of the wire. This orientation, which is believed to be advantageous, is clearly visible in the micrographs of a similar sample (P3/1.5P1PP) where the regular arrangement and considerable continuity in the crystal structure is evident. This accounts for the interesting properties of these superconductor samples.

EXAMPLE 14

Preparation of a bimodal precursor of lead BSCCO 2223 (BL714).

Nominal composition: $Bi_{1.8}Pb_{0.33}Sr_{1.87}Ca_2Cu_3O_n$ (made of a mixture of BSCCO 2212 already prepared (0.1 Mol) having a nominal composition $Bi_{1.8}Sr_{1.8}Ca_{0.9}Cu_{1.8}O_n$, and a complementary portion of the precursor having a suitable nominal composition, 0.1 Mol; nominal composition $Pb_{0.33}Sr_{0.07}Ca_{1.1}Cu_{1.2}O_{n''}$.

A) Working similarly to the method described in Example 4, a sample of BSCCO 2212 was prepared.

41.94 g of $Bi_2O_3$ were dissolved in 512 g of glacial acetic acid, the solution was diluted with 616 g of water and 14.32 g of CuO were dissolved therein. Afterwards 26.57 g of $SrCO_3$ and 9.01 g of $CaCO_3$ were gradually dissolved. To the solution thus obtained 613 ml of the "condensation product" solution, prepared according to Example 1, were added under stirring. After concentrating to about 400 ml under stirring, the final drying was performed as previously described in a covered beaker at a temperature of 130° C. The dry mass obtained was crumbled and heated to 550° C. in an alumina crucible in the absence of air. The crucible was uncovered, to expose the product to the air, and heated to and maintained at 710° C. for 16 hours.

Upon cooling, the powder was ground in an agate mortar, placed in a small basin made of silver open to the air and heated to 845° C. for 19 hours to obtain phase 2212. The product formed was crumbled in an agate mortar.

B) The quantity required for the complementary portion was prepared in a similar way.

200 g of acetic acid were diluted in 400 g of water and 9.546 g of CuO were dissolved into this solution while heating moderately under stirring. Afterwards 12.514 g of Pb(COCH$_3$)$_2$ trihydrate, 1.033 g of SrCO$_3$ and 11.011 g of CaCO$_3$ were gradually dissolved in the solution while stirring and heating. To the thus obtained solution 178 ml of the abovementioned "condensation product" were added. The solution was then concentrated to less than 280 g of total residue, and then dried overnight in a covered beaker, in an oven at 130° C.

The dry mass obtained was crumbled and heated to 500° C. in an alumina crucible in the absence of air. The crucible was then uncovered, to expose the product to the air, and heated to and maintained at a temperature of 710° C. for 17 hours.

The 2 portions A) and B) were finally combined and mixed together. The mixture was then ground with a suitable quantity of absolute ethyl alcohol in an agate mortar, in a dry atmosphere.

After drying, the mixture was heated in air at 710° C. for 15 hours and, upon cooling, the desired precursor powder was obtained.

Using this mixture a length of about 60 mm of a pure silver tube (outer diameter=8.5 mm, inner diameter=5.5 mm) was filled. The powder was packed uniformly to an apparent density of 3.23 g/cm$^3$. Before sealing both ends with pure silver covers, the tube was heated to 815° C. in air for 17 hours, then for another 2 hours to 820° C. and finally cooled. After sealing, the tube was cold drawn several times, each time reducing the diameter from 3 to 5 % until a final diameter of 1.1 mm was obtained.

The drawn wire was then cold-finished using rollers having a diameter of 50 mm and rotating at a rate of 0.6 cm/second until a final wire thickness of 0.100 mm was obtained by a series of steps, each step reducing the diameter by 10% (wire B6).

Two lengths of about 50 mm of this wire were heated to 825° C. in an argon stream, containing 8% (v/v) oxygen, for 25 hours (the temperature increase and decrease rate was of 150° C. per hour). The two wires were cold-finished again to a final thickness of 0.090 mm and then heated as before, but for 50 hours. The wires were then cold-finished a third time to a diameter of 0.090 mm and again heated for 100 hours. The samples B6/1.1L1LL and B6/1.1L2LL were obtained and showed, respectively, a value for Jc of 9345 and 8940 A/cm$^2$ at 77 K and B=0 T.

For comparison, two similar samples (B7/1.1L1LL and B7/1.1L2LL) obtained following the abovementioned method, but starting from a precursor powder of phase 2223 having the same average elemental composition, but initially containing predominantly phase 2212 and only 10% of phase 2223, showed Jc values of 842 and 1065 A/cm$^2$, respectively. The aforesaid powder had been produced from a nitrate solution through precipitation in the oxalates form.

I claim:

1. A method for preparing a precursor for a superconductor, comprising adding a condensation product to an aqueous solution of metal salts, totally or partially removing water from the mixture thus obtained to make a viscous mass, subsequently processing the viscous mass, wherein the condensation product is an esterification product of citric acid with ethylene glycol which is prepared prior to adding it to the aqueous solution of metal salts and the solution of metal salts is substantially a solution of an acetate of a metal selected from the group consisting of yttrium, barium, bismuth, copper, lead, strontium, calcium and mixtures thereof, in water and acetic acid.

2. A method according to claim 1 wherein the acetates are prepared in situ by treating metallic compounds selected from the group consisting of oxides, carbonates, citrates and hydrates of yttrium, barium, bismuth, copper, lead, strontium and calcium, with acetic acid.

3. A method according to claim 1 or 2 wherein the addition of the condensation product is performed at a temperature of from 60° C. to the boiling temperature of the reaction mixture.

4. A method according to claim 1 wherein the condensation product of citric acid with ethylene glycol is prepared by reacting from 0.5 to 5 ml of ethylene glycol with each mole of citric acid at a temperature of from 110° to 170° C.

5. A method according to claim 4 wherein the ratio of ethylene glycol to citric acid ranges from 0.7 to 2.

6. A method according to claim 4 wherein the ratio of ethylene glycol to citric acid ranges from 0.9 to 1.2.

7. A method according claim 1 wherein the viscous mass is concentrated under stirring until the viscosity of the mixture is such that stirring is blocked and the product thus obtained is then dried it up to about 130° C.

8. A method according to claim 1 wherein the viscosity of the viscous mass is such that it is possible to spin it or deposit it in the form of a layer of film up to 20 micrometers thick on a support made of any of silver, aluminum, strontium titanate and magnesium oxide, or of a mixture or an alloy thereof.

9. A precursor for a superconductor prepared with the method according to claim 1.

10. A precursor for a superconductor according to claim 9 wherein said precursor has the same composition as the superconductor prepared therefrom.

11. A precursor for a superconductor according to claim 9 wherein the composition of said precursor is not the same as that of the superconductor prepared therefrom.

12. The method of claim 1 wherein the viscous mass is subsequently processed to obtain fibers, layers or coatings on a support.

* * * * *

UNITED STATES PATENT AND TRADEMARK OFFICE
CERTIFICATE OF CORRECTION

PATENT NO. : 5,480,862
DATED : Jan. 2, 1996
INVENTOR(S) : Miszenti

It is certified that error appears in the above-indentified patent and that said Letters Patent is hereby corrected as shown below:

```
Col.  9, line 17, change "2,884" to --2.884--;
Col. 11, line 29, change "8400°" to --840°--;
Col. 14, line 59, change "YO₀.₉" to --Y₀.₉--;
Col. 16, line 8, change "7,254g" to --7.254g--;
Col. 17, line 21, change "Jc(4.24K," to --Jc(4.2K,--;
Col. 17, line 23, change "Jc(4.24K" to --Jc (4.2K,--;
Col. 21, line 18, change "J=5740" to --J_c=5740--;
Col. 22, line 4, change "air°" to --air,°--;
Col. 24, line 42, change "it" to --at--.
```

Signed and Sealed this

Fourteenth Day of May, 1996

Attest:

BRUCE LEHMAN

*Attesting Officer*     *Commissioner of Patents and Trademarks*